United States Patent [19]

Pfeiffer et al.

[11] 4,022,927
[45] May 10, 1977

[54] METHODS FOR FORMING THICK SELF-SUPPORTING MASKS

[75] Inventors: Aloysius T. Pfeiffer, Peekskill; Lubomyr T. Romankiw, Briarcliff, both of N.Y.

[73] Assignee: International Business Machines Corporation, Yorktown Heights, N.Y.

[22] Filed: June 30, 1975

[21] Appl. No.: 592,001

[52] U.S. Cl. .................................. 427/43; 96/35.1; 96/36.2; 250/492 R; 427/272; 427/273
[51] Int. Cl.² ........................................ B05D 3/06
[58] Field of Search ............. 427/43, 36, 272, 273; 96/35.1, 36.2; 250/492, 320, 322, 323

[56] References Cited
UNITED STATES PATENTS

| | | | |
|---|---|---|---|
| 3,152,938 | 10/1964 | Osifchin et al. | 204/18 |
| 3,458,370 | 7/1969 | Cone | 156/655 |
| 3,561,964 | 2/1971 | Slaten | 96/36.2 |
| 3,712,816 | 1/1973 | Blome et al. | 96/38.3 |
| 3,740,280 | 6/1973 | Ronen | 96/36.2 |
| 3,758,326 | 9/1973 | Hennings et al. | 428/195 |
| 3,832,176 | 8/1974 | Verstraete et al. | 96/67 |

OTHER PUBLICATIONS

Koops, "Optik", v. 36, pp. 93–110.

*Primary Examiner*—John H. Newsome
*Attorney, Agent, or Firm*—Pollock, Vande Sande & Priddy

[57] ABSTRACT

A method of constructing a relatively thick, self-supporting mask suitable for electron beam projection processes. Thickness is achieved by multiple steps of coating with resist, exposure and development. Either positive or negative resist may be used for second and subsequent coatings. Second and subsequent exposures are directed through the first relatively thin mask formed and through the substrate to eliminate critical alignment of subsequent masks. When desired thickness is achieved an even thicker frame may be fabricated for support purposes and the mask may then be lifted off the substrate on which it had rested during the fabrication steps.

When positive resist is employed, the resist remaining after development is baked on to give added structural strength to the mask. This baked resist can be coated with an additional layer of metal by evaporation or sputtering to give greater mechanical strength. When negative resist is employed, the portions of the resist protected by the relatively thin previously formed mask are removed and additional material is plated to increase the thickness and strength of the mask. The unprotected resist material is then also removed. The completed mask can be further strengthened by evaporating or sputtering an additional layer of metal or oxide.

44 Claims, 22 Drawing Figures

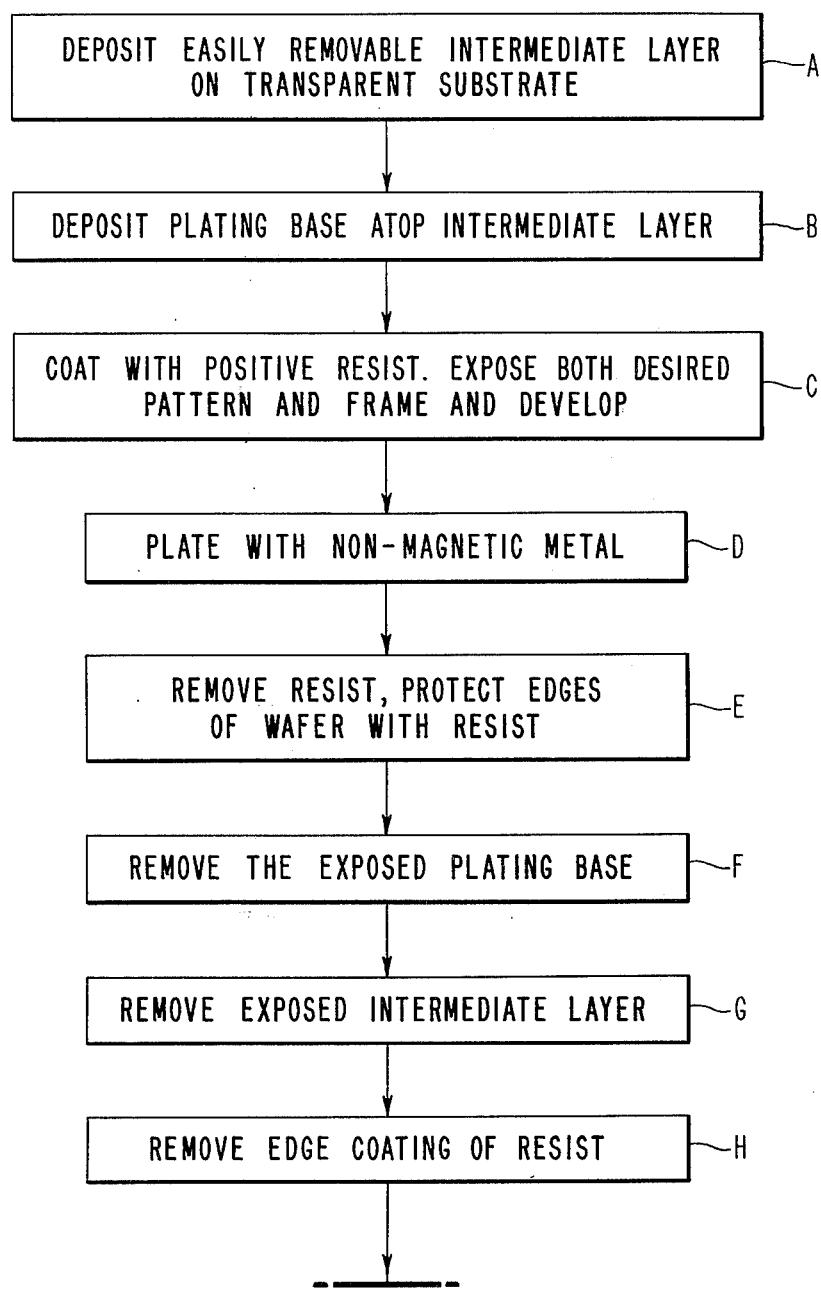

METHODS FOR FORMING THICK SELF-SUPPORTING MASKS

FIELD OF THE INVENTION

The present invention is directed at methods for forming self-supporting masks adapted to be employed in electron beam projection lithography and x-ray lithography.

BACKGROUND OF THE INVENTION

In the past few years the lithographic technology applied to transferring patterns from masks to devices under construction has become highly developed and widely used. Masks, such as those employed in these processes, are used with a variety of radiation sources such as light, both visible and ultraviolet, as well as x-rays and electron beams. An example of an electron beam system is given in Broers et al. U.S. Pat. No. 3,876,883. Other systems employing light as a radiation source are found in U.S. Pat. Nos. 3,152,938; 3,458,370; 3,712,816; 3,758,326 and 3,832,176.

Masks for use with electron beam projection processing apparatus, such as that disclosed in the aforementioned Broers et al. patent have a number of requirements in common with other masks, and some requirements which are unique to electron beam masks. In the first place, one desires the ability to provide a small aperture which is well defined. The desire for this characteristic should be apparent to those skilled in the art in that the minimum size opening in the mask limits the size of the smallest feature that can be transferred from the mask to any receiver. The ability to transfer a particular pattern is based upon the mask definition of that pattern. In addition to the foregoing requirements, however, a requirement unique to electron beam projection masks is the requirement that the mask be self-supporting, even if the mask is heated during its operation by absorption of electrons. Since the electron beam is substantially incapable of passing through even the thinnest of substrates, the mask must be characterized by the absence of material at locations where it is desired that the electron beam pass through the mask. Since the mask must have sufficient strength and rigidity to remain in an integral condition without outside support, the mask itself must be thick enough to provide this function. To provide self-support the mask thickness must exceed the lateral dimension of the smallest aperture in the mask. That is the ratio of thickness to lateral dimension (or aspect ratio) must be $> 1$. In addition, since most, if not all, electron beam projection systems employ magnetic focusing coils to project a pattern smaller by a factor as much as 10 times smaller that the original pattern one desires the mask to be comprised of nonmagnetic material so as to not interfere with the focusing operation. Masks produced by this technique can also be used as x-ray masks in x-rays lithography.

Although the prior art evidences methods of forming masks and screens a problem exists in providing a mask which is thick enough to be self-supporting, particularly when heated as by impact of electrons and when about 3 inches in diameter which is capable of providing a very small aperture, which are well defined and with aspect ratio $> 1$. The prior art processes are sufficient to provide small apertures reasonably well defined by employing a computer controlled mask or the like and exposing an electron beam or photoresist or other radiation sensitive material to radiation which is modulated by the mask. A single such exposure will not, however, in accordance with the prior art teachings, provide a sufficiently thick mask to be self-supporting. If one attempts to increase the thickness by merely extending the parameters of the prior art processes defininition is degraded. On the other hand, it is possible to employ a plurality of exposures of a photoresist or other suitable radiation sensitive material with the well known steps of developing and/or developing and plating between exposures. One difficulty with this approach is that the masks employed for the several exposures must be aligned with the object being manufactured in each of the different exposures. Due to the extremely small dimensions of the various pattern components on the mask this has proved to be a time consuming operation.

It is therefore an object of the present invention to provide a method of fabricating a mask suitable for electron beam processes which eliminates the necessity for precise alignment in several different exposures. It is another object of the present invention to provide a method for fabricating a mask suitable for electron beam process which is self-supporting and yet which eliminates the necessity for precise mask alignment during fabrication of the mask itself.

SUMMARY OF THE INVENTION

These and other objects of the invention are achieved by employing conventional processes to fabricate a relatively thin mask deposited on a substrate with an intermediate layer lying between the mask and substrate. Both the substrate and the intermediate layer are selected to be transparent to radiation employed in the following steps of the process. The material of the intermediate layer is selected so that it can be easily selectively removed in order to lift the mask off the substrate at the conclusion of the process. The several steps of the inventive process are particularly directed at increasing the thickness of the mask without requiring precise alignment during the exposure step or steps.

More particularly the carrier substrate is coated with a readily selectively soluble metal or polymer (which will be removed after the mask fabrication is completed) to form an intermediate layer. This layer is then metallized with a thin cathodic platable metal layer. Positive resist is then coated and exposed with the desired pattern. After developing the thin (about 1 to 3 microns) metal mask is then electro formed by electroplating. The resist is removed, the exposed cathode layer is removed by a short chemical or sputter etch and the exposed intermediate layer is removed until the radiation passing through the thin mask gives good pattern definition.

Initially the exposed surface of the partially completed mask is coated, to a desired thickness, on its exposed surface with a material which is sensitive to selected radiation. The mask is then exposed to the selected radiation in an orientation in which the substrate lies between the mask and the radiation source. Subsequent to exposure the coated material is developed to selectively remove areas of the undesired material.

In one preferred embodiment of the invention the material coated on the carrier substrate may be a readily selectively soluble metal or polymer which will be removed after the mask fabrication is completed. This layer is then metallized with a thin cathodic platable metal layer. The surface of the cathode metal layer is then coated with a positive resist and the selected radiation may comprise ultraviolet light. In this embodiment, subsequent to the development step, the remaining resist is baked on under controlled conditions. In this embodiment the steps of coating, exposing, developing and baking can be repeated any number of times as desired to increase the thickness of the mask. To complete processing of the mask the intermediate layer is removed to lift the mask from the substrate thereby providing a relatively thick self-supporting mask suitable for electron beam projection processing. If desired the mask can be further strengthened by evaporating 1 to 3 microns of a suitable nonmagnetic metal on the top or bottom of the mask.

In another preferred embodiment of the invention after electroforming the thin metal mask and opening holes for transmission of suitable radiation the material coated on the mask comprises a negative photoresist and the selected radiation may comprise ultraviolet light. In this embodiment, subsequent to the development step metal may be plated into the areas from which unexposed resist has been removed during development. The steps of coating, exposing, developing, and plating can be repeated any number of times to increase the mask thickness to any desired level, each time using the product of the previous process to define the pattern. When the mask has reached desired thickness the remaining resist and the intermediate layer is removed lifting the mask off the substrate to thereby provide a relatively thick self-supporting mask suitable for electron beam projection processing.

In another embodiment of the invention the radiation sensitive material may comprise a negative resist, the selected radiation may comprise x-rays so long as the originally electroformed mask is of a material and of a thickness suitable to absorb x-rays while the substrate and intermediate layer comprises a material which is capable of transmitting x-rays.

Preferably, in each of the embodiments, additional steps are included to provide a circumferential frame about the mask which is even thicker than the thickness of the mask itself, for structural purposes.

Those of ordinary skill in the art will understand that a generic feature of the different embodiments of this invention is the exposure, of a partially completed mask with radiation sensitive material coating the exposed surface, through the substrate. In effect, the partially completed mask acts as a mask for the second and any subsequent exposure steps in the process of completing fabrication of the mask. This provides for perfect alignment with substantially no effort since the alignment follows from the relationship between the several elements during exposure. Namely, the partially formed mask lies between the radiation sensitive material and the source of radiation so as to selectively block or protect selected areas of the radiation sensitive material. From another viewpoint the partially formed mask is effective to modulate the radiation with the desired pattern before it exposes the resist. In this respect this application discloses subject matter common to the Feder et al. application Ser. No. 591,986 (Y0974-044) assigned to the assignee of this application and filed concurrently therewith.

BRIEF DESCRIPTION OF THE DRAWINGS

The present invention will be explained in this specification when taken in conjunction with the attached drawings in which.

DETAILED DESCRIPTION OF THE PREFERRED EMBODIMENTS

Figure 1A:
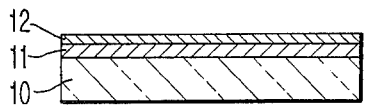
FIGS. 1A–1I are cross sections of a wafer in various stages during the fabrication of a mask employing a preferred embodiment of the inventive process.
Figure 1B:
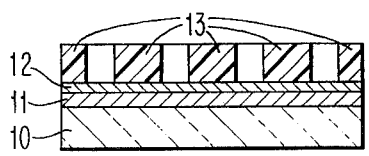

FIGS. 1A through 1J are cross sections of a wafer being processed to form a mask employing the inventive process. These figures illustrate one preferred embodiment of the invention in which ultraviolet light comprises the selected radiation and a positive photoresist or x-ray sensitive resist is employed as the radiation sensitive coating material. FIG. 1A illustrates a step in the process in which the substrate 10 carries an intermediate layer 11 which itself is covered by a plating base 12. More particularly, the substrate may comprise quartz, glass, U.V. transparent polymers or any other substrate which is transparent to ultraviolet light or polymers which are transparent to x-ray radiation. The intermediate layer may comprise a 500 to 5,000 A layer of Mg., Ti, Al, Cr, Hf, Nb, Zn, Sb alloys or a combination of the foregoing. Other materials can be employed so long as the material can be easily selectively etched at the conclusion of the operation to permit the mask, which will be fabricated on top of the intermediate layer, to be lifted or floated off. The intermediate layer may be deposited using electroplating, electroless deposition, evaporation, sputtering or other suitable process. Alternatively, the intermediate layer may comprise an organic polymer which is transparent to ultraviolet light or x-rays but which is readily selectively dissolved in a solution which is not used in the subsequent fabrication steps of the mask. On top of the intermediate layer 11 is a layer (approximately 300 to 3,000 A) of a plating base metal 12 such as Cu, Au, Ag, Pd or Pt or other readily platable material. Of course, the plating base metal is chosen to be compatible with the metal which is to ultimately form the mask. The deposition of this plating base may take the form of evaporation chemical vapor deposition or electroless plating. FIG. 1B illustrates a further step in the fabrication of the mask. More particularly, a resist 13, which may be a positive resist (such as Shipley 1350J) has been coated, such as by spin coating on top of the plating base 12. The thickness of this layer may be in the range of from 1 to 5 microns. A circle mask or frame is then employed to expose the coated resist near the edges of the wafer and then a development step removes the exposed resist around the edges of the substrate (or wafer). At this point, it may be advisable to clean the edges of the substrate with acetone or other substance which readily dissolves the resist. Another exposure step is performed and the desired mask pattern is exposed and developed into the resist. This step defines the edges of the final pattern and therefore correct exposure and development are crucial. For this purpose a high resolution silver emulsion or high resolution optical chrome mask is used. When using an optical mask it is of utmost importance to maintain excellent contact between the mask and the surface being exposed. For that purpose a thin glass conformable mask may be used. Alternatively the pattern is exposed using a high resolution electron beam or x-ray radiation. After development the mask now takes the form illustrated in FIG. 1B on which the developed resist 13 is shown as residing inside the exposed circle mask (not shown) and in the configuration of the desired pattern. The pattern shown in FIG. 1B is, of course, merely for purposes of illustration. Typically, the desired pattern can be an array of 0.2 mil squares or bars on 0.4 mil centers or 0.1 mil squares or bars on 0.2 mil centers.

Figure 1C:
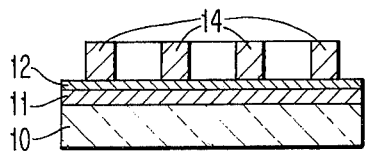
Figure 1D:
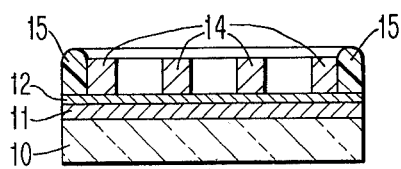

The next step in the process is to electroplate a non-ferrous metal or metal alloy using constant current, potentiostatic or pulse potentiostatic plating using the deposited and developed resist as a pattern. In this step, from 1 to 3 microns of non-magnetic metal compatible with the plating base layer is employed. If the intermediate layer is a polymer or a reactive metal such as Ti or Cr the plating material must, of course, be compatible with that intermediate layer. (By compatible is meant a material which will not be attacked by materials employed to lift off the mask by attacking the intermediate layer). FIG. 1C then illustrates the mask subsequent to removal of the remaining resist. FIG. 1C shows the plated metal 14 atop the plating base 12 in the desired pattern. At this point, additional resist is spun on the edges such as by placing the wafer on a spinner and contacting the edges with a swab dipped in resist, which may be the previously mentioned resist. This edged coating will protect the plating base metal from the etchant which will be used in the next step. FIG. 1D shows the plating metal 14 surrounded at the edges by the resist edge protection 15.

Figure 1E:
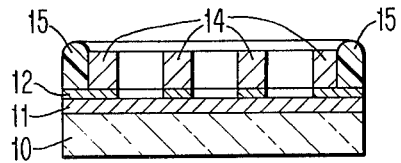
Figure 1F:
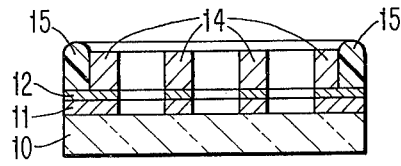

The wafer is then processed to remove the plating base metal layer 12 where there are openings defined by the plated metal portions 14. This metal may be removed by sputter etching, ion milling or other suitable means. FIG. 1E illustrates the condition of the wafer subsequent to this etching step. As shown in FIG. 1E portions of the intermediate layer 11 are now exposed. At this point, the exposed portions of the intermediate layer 11 are removed by another etching operation (which may be chemical etching). At this point a precise control of the etching rate is necessary because it is preferred to limit undercutting the intermediate layer to a minimum. Otherwise the mask can be prematurely lifted off the substrate. Subsequent to this second etching operation the wafer is in a condition illustrated in FIG. 1F in which the substrate is now exposed between portions of plated metal 14 and the remaining portions of the intermediate layer 11 and plating base 12.

The resist edge protection 15 is now removed. The wafer is now coated with a positive resist (such as Shipley 1350J or PMMA). This resist coating can be relatively thick, as thick as 15 microns (or up to 15 to 20 $\mu$). The coating must be carefully executed so that the resist will penetrate and fill the holes. This can be accomplished by first spinning on a dilute resist followed by a resist in non-diluted form. Alternatively when the resist is still wet and flowing a vacuum can be applied, while spinning, which will make trapped air bubbles escape from crevasses and will fill them with resist. A ring and frame mask can now be employed to expose the edges of the resist while the center of the active part of the wafer is covered by a mask. This exposure can be conventional, i.e., employing a mask located between the radiation source and the exposed surface of the positive resist 16. At this point, the wafer is subjected to an additional exposure of ultraviolet light or x-rays with the substrate placed between the ultraviolet or x-ray source and the resist as shown, for instance, in FIG. 1G. As is conventional in the art the exposure time can be determined by the thickness of the resist. After exposure the resist is developed and the wafer takes the form shown in FIG. 1H. The voids 16' in the resist 16 are produced as a result of the exposure with the ring and frame masks. However, the voids between the plated metal 14 occur by reason of the exposure through the substrate. This exposure, of course, employs the masking qualities of the originally plated metal 14 to protect (from exposure) those portions of the resist above the plated metal portions 14. In this fashion, perfect optical alignment is achieved.

At this point, it is preferable to bake the remaining resist as indicated in the following table:

From room temperature to 60°C — hour vacuum;
then to 120°C — 1 hour vacuum
then to 250°C — 2 hour vacuum
turn off heater and let oven return to room temperature.

Although the preceding baking procedure is preferable it is sufficient and often desirable to increase the temperature of the resist only to above 135° C to destroy the sensitizer in the resist. Where PMMA is used it is only necessary to raise the temperature to about 110°–120° C. In addition to destroying the sensitizer in the resist the baking greatly increases the cross-polymerization substantially increasing the strength of the baked-on resist. Additionally, under the influence of heat, and by reason of surface tension forces, the heated resist tends to flow rounding the upper edges of any exposed holes. This is a substantially advantageous effect since it allows thick layers of resist (up to 15–°λ microns) to be employed. Of course, the thickness of the resist reduces the effects of radiation at the upper most boundaries of the resist. This may result, in only opening a small hole during the development process. However, this heating, and the surface tension forces, combine to increase the diameter of the open hole so as to compensate for any excessively thick resist.

The height of the added and now baked resist 16 may be found to increase the strength of the mask to such an extent that further height is not necessary. However, if it is desired to increase, still further, the height of the mask, then the preceding steps, beginning with coating with the positive resist (shown in FIG. 1G) can be repeated any number of times. Each subsequent exposure, employs ultraviolet light transmitted through the substrate to provide for perfect optical alignment between the remaining portions of the resist as well as the originally plated metal 14.

When the height of the baked-on resist layer 16 is deemed sufficient, additional resist 17 is applied in a relatively thick layer, such as up to 20 microns. Subsequently, a circle or frame mask, or a combination of the two is employed in a conventional exposure operation, exposing the resist from above to define a support frame for subsequent electro-plating. At this stage in the processing the wafer takes the form illustrated in FIG. 1I in which the thick positive resist 17 is illustrated as having been exposed in an area for plating of a frame. Electro-plating now occurs providing frame material in the areas 16' up to the height of, or even above, the thick positive resist 17, which may be on the order of 20 microns. Subsequently, the remaining resist 17 is removed.

Figure 1G:
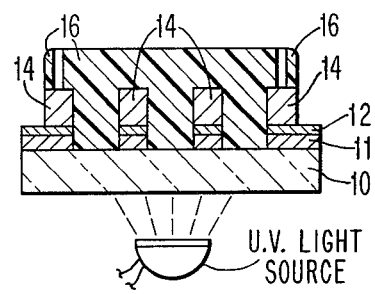
Figure 1H:
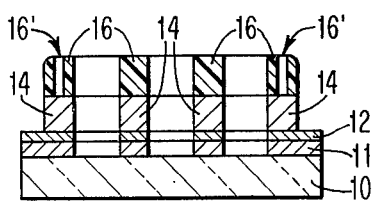
Figure 1I:
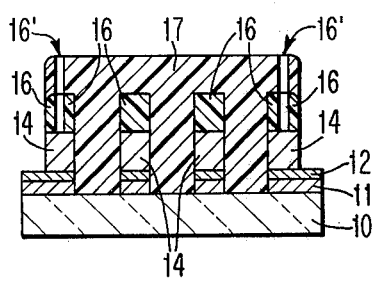
Figure 1J:
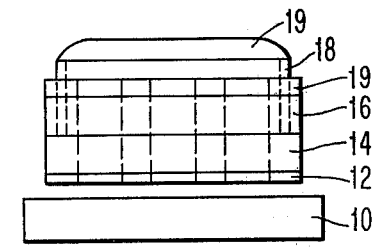
FIG. 1J is an end view of the completed mask and FIG. 1K is an isometric view, partially broken away of the completed mask.

The mask then takes the form illustrated in FIG. 1J (without the layer 19) which shows the frame 18 as having been plated atop the originally plated mask 14 and also shows the additional resist layer 16.

The next step in the process is to etch away the intermediate layer 11 with a chemical which will attack the intermediate layer and not the mask itself. Thus, as shown in FIG. 1J the intermediate layer 11 is removed and the mask is floated off the substrate 10. In order to show the unitary nature of the self-supporting mask FIG. 1J is an end view of the mask with an arbitrary pattern whereas the FIGS. 1A through 1I are cross sections through an arbitrary mask.

At this point if further mechanical strength and/or heat conductivity is required the mask is placed in a conventional evaporater or sputtering apparatus and an additional 1 to 3 microns of metal 19 is deposited preferably onto the top surface of the mask (as shown in FIG. 1J). In this operation the mask is preferably suspended at least about 5 microns away from the substrate so that the deposited metal does not fuse to the substrate.

Figure 1K:
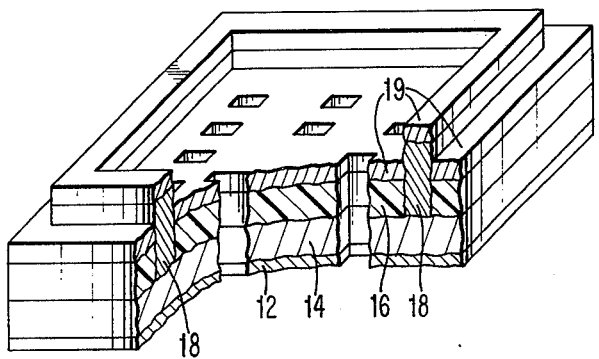

FIG. 1K is an isometric view of the completed mask, partially broken away particularly illustrating the thick supporting frame 18 and the relationship of the active area of the wafer with an arbitrary pattern. The different layers are illustrated in the parts of the drawing which is broken away.

Before describing another preferred embodiment of the invention which employs a negative resist instead of the positive resist employed in FIG. 1G, FIG. 2 will be discussed which illustrates a flow diagram of both of these processes.

Figure 2B:
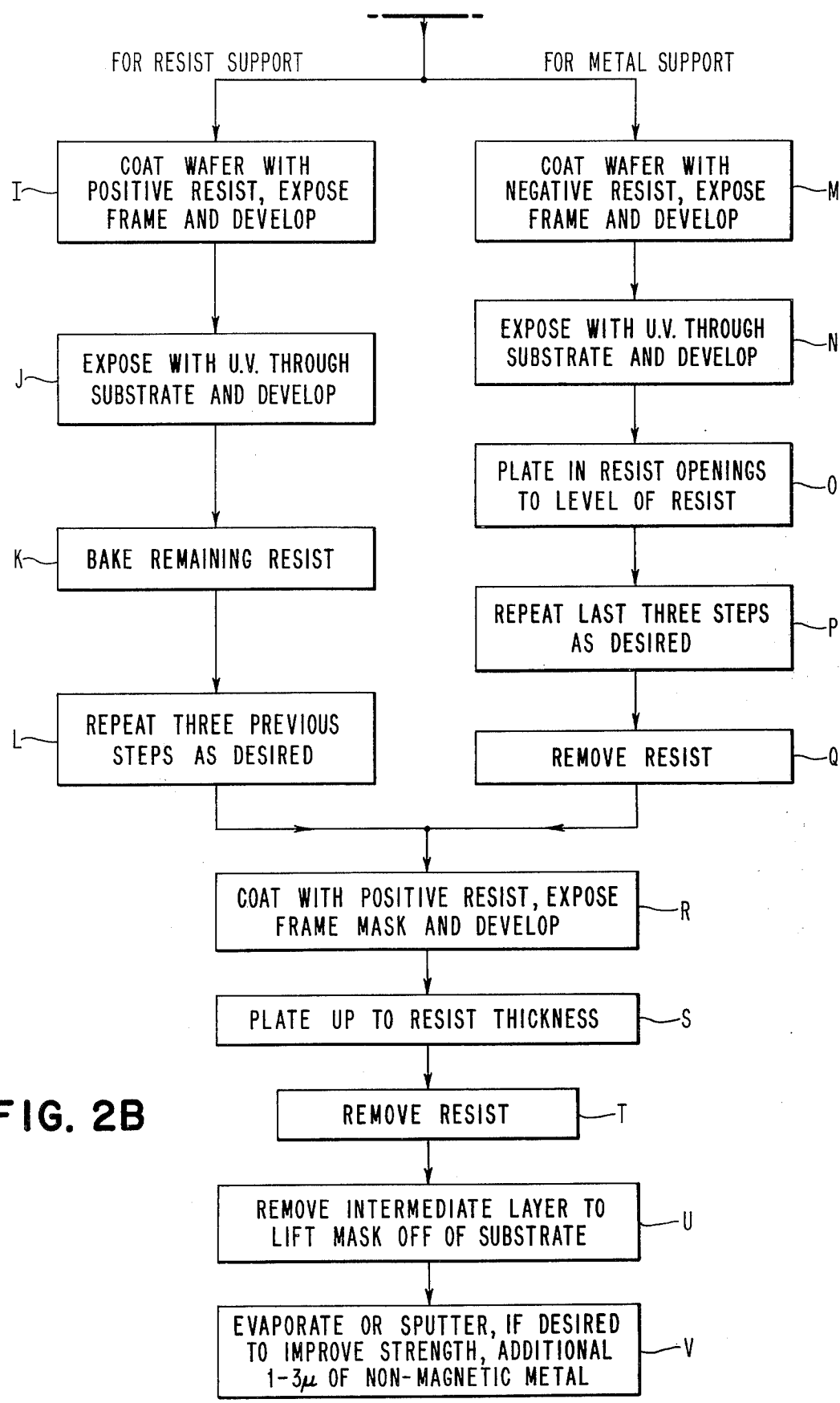
FIG. 2 is a flow diagram illustrating the different steps of preferred embodiments of the inventive process.

In FIG. 2, step A, the first step of the process is the deposition of an easily removable intermediate layer on a transparent substrate. As mentioned with regard to FIG. 1J the intermediate layer 11 will, at the conclusion of the process, be selectively etched away. Therefore the material of the intermediate layer should be material which can be selectively etched by a particular etchant which at the same time will not attack the mask material per se. The substrate 10 should be transparent to the radiation employed in the process step corresponding to FIG. 1G, which is an illumination of the coated resist through the substrate itself. Although FIG. 1G specifies ultraviolet light, those of ordinary skill in the art will understand that other forms of radiation, such as x-rays, may be used as well, although it may be necessary to select a substrate different than glass in view of the radiation employed. The thickness of the intermediate layer employed may be in the range of 300 A to approximately 1 micron. The thicker the intermediate layer the more quickly will the etchant attack it and float off the mask in the concluding step of the process. On the other hand, increasing the thickness of this layer will also increase either the micro or macro unevenness in the surface which is, of course, undesirable.

Step B is the deposition of a plating base atop the intermediate layer. This layer itself can be 300 to 3,000 A in thickness but should be deposited at a low enough temperature to avoid alloying the plating base layer with the intermediate layer below it.

Step C is a coating of the plating layer with a positive resist such as a Shipley, electron sensitive resist such as PMMA or x-ray sensitive resist. This coating can be in the range of thickness from 1 to 5 microns. The coating procedure itself can employ any procedure known in the art including spin coating, dip coating, roller coating and spray coating. The first exposure sub-step in step C is exposure of a circle mask to reduce the thickness of resist at the edge of the wafer. The pattern to be employed as the mask is now transferred to the resist by a subsequent exposure which may employ uv exposure, x-ray exposure or an electron beam. The resist is then developed.

Step D is plating, employing the developed resist as a pattern. The material plated forms the first thin layer of the mask and can be as thick as the resist (1–5 microns).

In step E the resist may be removed with a suitable solvent such as acetone, in the case of Shipley resist, and the edges of the wafer are protected with a resist coating, such as by spinning on the resist coating from a swab dipped in the resist.

In step F the exposed plating base is removed by any one of a number of known processes.

In step G the portions of the intermediate layer which are now exposed are also etched, for instance in a solution of $AlCl_3$ taking care not to under cut the portions of the intermediate layer which are supporting the plating layer of the mask.

In step H the edge coating of the resist can now be removed with a solvent such as acetone. At this point in the process the wafer takes the form shown in FIG. 1F except that the edge coating 15 has been removed. Now either steps I through L or steps M through Q can be employed. Both steps I or M are coating with a resist. The steps I through L employ a positive resist and result in additional mask layer or layers comprising baked-on resist material. On the other hand, the steps M through Q employ a negative resist and result in a mask with additional metal layers plated atop the original plated metal 14. In either case, the coating of the wafer with the next resist layer is critical. That is with either step I or M it is essential to ensure that the coated resist completely fills the holes between the plated metal layers down to the substrate 10. To achieve this the wafer coated with resist may be subjected to a vacuum to drive out any trapped air bubbles under the resist. Preferably, however, a first coating of diluted resist is employed which is spun on. Subsequently, a thicker and more viscous full strength resist coating is also spun on. The first thin coating tends to flow into the corners and edges and prevents air from being trapped under the resist.

For purposes of explanation we will discuss the embodiment employing the negative resist, that is steps M through Q.

After the double coating step the next step N is an exposure of the wafer through the substrate 10 with ultraviolet light or x-rays (as shown in FIG. 1G) followed by conventional development of the resist. If desired, in order to completely remove the developed resist a plasma etch may be employed. Step O is a plating, for instance of gold or gold alloy, in the openings of the resist up to the level of the remaining resist.

At this point, if sufficient material has been plated to bring the mask up to the desired thickness, the remaining resist can be removed. However, in the general case additional platings may be desired. Although the remaining resist coating applied in step M can now be removed, preferably, this resist is allowed to remain and an additional coating is made. Just as was the case with step M, care should be taken in this coating to prevent the entrapment of air under the resist. Thus, steps M through O can be repeated as many times as desired in order to build up the thickness of the plated metal. When the plated metal has reached the desired thickness step Q can be performed to remove the remaining resist employing a suitable solvent.

Steps I through L correspond to steps M through Q except that in steps I through L a positive resist is employed. Since steps I through L have been discussed with respect to FIGS. 1A through 1J additional discussion at this point is deemed unnecessary.

Now that the mask has been build up to the desired thickness steps R through U are employed to produce a frame for additional structural support. These steps are substantially identical regardless of whether positive or negative resist has been used.

In step R additional positive resist is coated on the partially completed mask up to the desired thickness of a frame. A conventional exposure step is performed employing a frame or circle mask and development of the exposed resist provides a pattern for plating the frame. In step S the frame is plated up to the desired thickness often far exceeding the thickness of the resist. If desired, steps R and S can be repeated a number of times in order to develop the desired frame thickness. Preferably, the frame can be in the range from 12 to 30 microns and a suitable frame material is gold. Although the positive resist employed may be a Shipley resist (1350J) to a thickness of 15 to 30 microns, it is also possible, to provide a sufficiently thick frame, through use of a 1-2 mil thick Kodak KTFR or duPont's W riston resist.

Subsequent to plating the frame in step S, the resist is removed in step T by using a suitable solvent such as acetone or similar solvent.

Finally, the step which may conclude the process, step U removes the intermediate layer to lift the mask off the substrate. This step can be an etching operation employing a suitable chemical etchant, chemical plasma etching or by an electro chemical means. If desired, however, step V may be accomplished to deposit an additional layer of non-magnetic metal of about 1-3 microns.

FIGS. 3A to 3H illustrate the fabrication of a mask when employing a negative resist (that is using steps M-Q of FIG. 2).

Figure 3A:
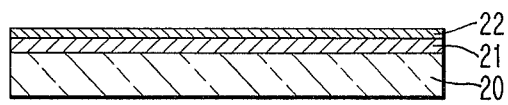
FIGS. 3A–3H are cross sections of a wafer in various stages during mask fabrication employing another preferred embodiment of the inventive process.
Figure 3B:
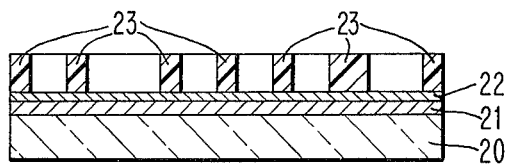
Figure 3C:
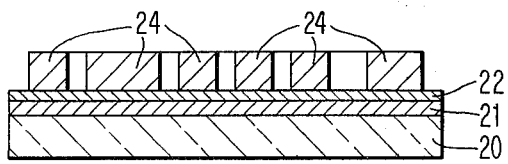

FIGS. 3A through 3H are a cross section of a wafer in various stages of mask fabrication employing the invention process. These Figures illustrate various stages in the fabrication in the mask in accordance with the principles of this invention to provide a self-supporting relatively thick mask suitable for electron beam processing. FIG. 3A illustrates a substrate 20 which may comprise quartz, glass or other material transparent to the radiation which will be used to illuminate the negative resist through the substrate 20. In the embodiment in which this radiation comprises ultraviolet light, glass transparent to that radiation could be employed. Alternatively, if X-rays are employed, this substrate would be a polymer or berylium or other dielectric such as $Si_3O_4$ which is transparent to that radiation. An intermediate layer 21 is deposited on the substrate 20. At the conclusion of the process this intermediate layer 21 will be etched away to separate the mask from the substrate 20. One method of depositing this intermediate layer comprises evaporation and the thickness of this layer may be from 500 to 5,000 A. The material of the layer can be one on more than one combination of the following non-magnetic materials; Cu, Ti, Zn, Cr, Ta, Hf or Sb. Atop this layer is deposited the plating base 22 which can also be evaporated and which preferably is 500 A in thickness. If we are using gold or platinum or other noble metal as the mask material this plating base can comprise copper, gold, zinc or platinum.

A positive type photoresist (such as Shipley 1350J or polymethyl methacrylate) is now deposited over the plating base with a thickness on the order of 1 micron (or within the range of 0.5 to 5 microns). Spin coating is a suitable method for depositing this resist although other coating methods may be employed. The wafer is then exposed to radiation suitable to develop the photoresist employing a circle mask, i.e., one that removes resist from around the edges of the substrate. After development the edge of the substrate can be cleaned for good electrical contact during later plating steps. The wafer is then again exposed and developed, this time, employing the desired mask pattern. Although the exposure steps can employ any one of a wide variety of known techniques for good pattern definition an electron beam photoresist is employed and an electron beam is employed as the exposing radiation. After the second development step the wafer takes the form of FIG. 3B in which the developed resist 23 is illustrated as taking on the pattern geometry.

The next step in the operation is to electro-plate any nonmagnetic metal in the areas defined by the developed resist. Generally, plating would take place in a range up to the level of the resist, thus in the range of 0.5 to 3 microns. The metal plated should be compatible with the intermediate layer, that is one that will not be attacked by the chemicals employed to etch the intermediate layer. The plating process itself can comprise constant current, potentiostatic, or pulse potentiostatic plating. After the resist is removed, the wafer takes the form shown in FIG. 3C in which the reference character 24 identifies the plated metal which now takes on the geometry of the mask used to expose the wafer.

A resist edge coating 25 is applied to protect the edges of the wafer during the next etching steps. This edge coating may take a form illustrated in FIG. 3D. FIGS. 3E and 3F illustrate the condition of the wafer subsequent the next two steps of the method. The next step is an etching of the plating base which is exposed between the plated metal portions 24. Typically this etching process may comprise sputter-etching. The next step, at the conclusion of which the wafer appears in the form illustrated in FIG. 3F, is a chemical etching operation to selectively etch those portions of the intermediate layer which have been exposed after removal of the exposed portions of the plating layer. This chemical etching process should be controlled so as not to under cut the intermediate layer. In the next step of the process the resist edge coating is removed employing a suitable solvent.

Figure 3D:
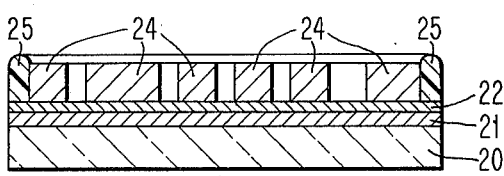
Figure 3E:
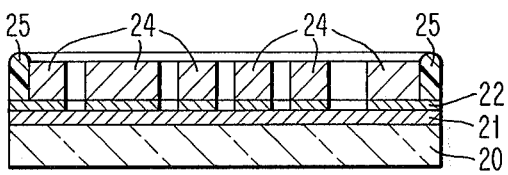
Figure 3F:
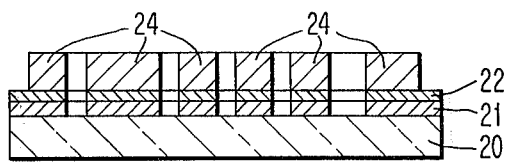
Figure 3G:
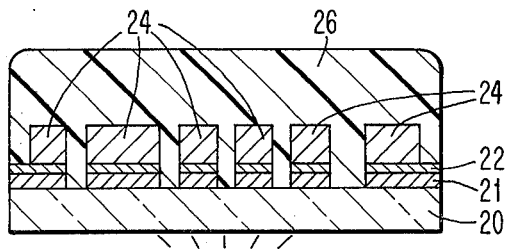

The next step of the process, illustrated in FIG. 3D is the coating of the wafer with a negative resist (such as KMER, KPR, KTFR, KOR, WRISTON or the equivalent negative working resist). Although the thickness of this resist is preferably in the range of between 1 to 15 microns, for large apertures (>7.5 microns) the thicker the better. We prefer to coat this resist in a pair of coating operations. The first operation is one employing a dilute resist to avoid entrapment of air underneath the resist in the holes between the plated metal 24. Subsequently, a second thicker solution of resist is spun coated to bring the resist to the desired thickness. After a resist is applied the wafer can take the form shown in FIG. 3G.

A subsequent step in the process is exposing the resist to radiation, which may comprise ultraviolet light. In order to avoid the necessity for an additional mask, and the concomitant registration problems, the resist 26 is exposed through the substrate 20. That is, the radiation source is placed on the opposite side of the substrate from the resist 26 which is to be exposed. The thicker the resist employed the longer is the necessary exposure time and the longer the exposure time, within practical limits, the better. After exposure the resist is developed and baked. If the resist proves to be too thick, of course, the unexposed resist will merely be removed in the developing step. Removal of resist covering the metal 24 is, of course, desired. Removal of other resist, because of lack of exposure is, on the other hand, not desirable. Furthermore, the resist may be so thick that the exposure does not open up holes commensurate in size with the distance between the plated metal pattern 24. The baking operation along with surface tension forces will tend to cure both problems and increase the opening of the holes at the surface. More particularly, the resist surfaces which may exhibit rounding can be flattened by heat or surface tension. The resist surface area corresponds to holes in the metal, after plating, so heat and surface tension, by increasing resist surface area, increase the hole opening in the plated metal.

Alternatives to the use of ultraviolet light, x-ray radiation may be employed under certain circumstances. Of course, if x-ray radiation is to be employed the resist must be a negative working resist sensitive to that radiation. Furthermore, and more important, the original plating 24 must be thick enough to provide a reasonable contrast ratio for subsequent processing. Furthermore, of course, the substrate 20 should be transparent to the x-ray radiation. After the resist is developed, another plating step (illustrated in FIG. 3H) can be carried out. The plating metal employed should be selected so that it is not attacked by the etchants employed in removing the intermediate layer in a later step of the process and also a metal which is neither cathodic nor anodic to the first plated layer. Any techniques consisting of constant current, potentiostatic or pulse potentiostatic plating may be employed.

Figure 3H:
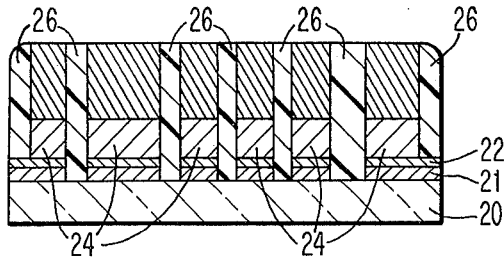

If the plating step, shown in FIG. 3H, does not produce a metal layer to a sufficient thickness for the desired purposes, additional steps of applying negative resist, exposure through the substrate, development and plating can be employed until the resulting mask thickness reaches the desired level. Of course, for each of the subsequent exposure steps, the exposure time should be increased inasmuch as the radiation must pass through thicker and thicker resist layers.

The remaining steps in the process are steps necessary to fabricate the mask frame and finally the removal of the intermediate layer to float the mask off the substrate. These steps can be similar to those explained with reference to FIGS. 1A through 1K, more particularly, FIGS. 1H-1K. These operations employ conventional exposure of the substrate through a frame mask.

As a further aid in describing the present invention a number of non-limiting examples will now be described of specific processes for fabricating a self-supporting mask suitable for electron beam projection. Example 1 employs a positive resist for the second exposure step whereas example 2 employs a negative resist.

EXAMPLE 1

On a substrate of glass, transparent to ultraviolet light an intermediate layer of Cr. is deposited by evaporating to a thickness of 3,000 A. A plating base of gold is evaporated to a thickness of 500 A at a low enough temperature to avoid alloying with the Cr intermediate layer. Positive resist, such as Shipley 1350J is now spin coated above the plating layer to a thickness of 2 microns. A circle mask is exposed and developed using conventional techniques, i.e., employing a mask located above the resist and the exposed resist is developed. The edges of the wafer are now cleaned with a swab dipped in acetone. The desired mask pattern is now exposed to u.v. of about − 3,500 A and developed employing conventional exposure techniques employing a high resolution chrome mask or high resolution silver emulsion mask. Gold is now electro-plated into the open areas in the resist to a thickness of 1 to 3 microns. The remaining resist is now removed with acetone. The wafer is spun and a swab dipped in resist is applied to the outside diameter of the wafer to put on the edge coating of resist. The plating base layer is now sputter etched where it is exposed between the 1 to 3 micron thick plated gold. The wafer is then placed in $AlCl_3$ bath to selectively etch out the intermediate layer which was exposed by the sputter etching operation. This process is controlled so as to not undercut or etch the Cr layer underlying the plated gold. Subsequent to the chemical etching the edge coating of resist is removed and the wafer is coated with a positive resist, such as Shipley 1350J or 1375, in two steps. In the first step dilute resist (diluted in a ratio 2 parts Shipley 1350J resist to 1 part thinner) is spun coated (at 3,000 RPM). A second coating step employs a thicker resist (diluted in a ratio of 6 parts Shipley 1350J resist to 1 part Shipley 1350J thinner) and also spun on at 3,000 RPM. The two resist coatings produce a 2 micron thick resist film. A circle and frame mask, or a combination of the two, are now employed in a conventional exposure operation, i.e., placing the masks between an ultraviolet light source (3,500 A) and the surface of the resist. Desirably, this is a relatively long exposure, as over exposure is desirable. The resist is also exposed to additional ultraviolet light (also about 3,500 A) with the substrate located between the light source and the resist coating. The length of this exposure is dependent upon the thickness of the resist coating, approximately 25 seconds is desirable for a 2 micron thick resist. All three patterns are now developed using a conventional solvent. The remaining resist is now baked to raise the temperature of the resist to above 135° C (to destroy the sensitizer in the resist) to result in as much cross polymerization as possible without, at the same time, causing the resist to flow which might obscure the apertures. Typically the temperature is raised in stages, first to 60° C, then to 120° C and then to 200°–250° C in an oven and then the oven is allowed to cool to room temperature. For a complex pattern such as zig-zag the baking period at 120° C may be restricted to 5–10 minutes and that at 250° C may be limited to 1 minute. On the other hand other patterns may allow baking at 120° C for 1 hour and at 250° C for 2 hours. An additional 2 micron layer of Shipley 1350H resist is applied above the baked on resist. Using conventional exposure techniques a circle and frame mask or a combination of the two are exposed and developed. Gold is now electro-plated in the areas from which resist was removed by developing to a thickness of 10 microns to form a gold frame. The remaining unbaked resist is removed using a conventional resist removal technique. The intermediate layer is etched in a saturated solution of $AlCl_3$ at 90° C for approximately 3 to 4 hours or longer, as is necessary to float the mask off the substrate. If it is desired to further strengthen the completed mask it may be suspended in an evaporator and 100 A of Cr and 1 to 2 micron of Au may be evaporated on the baked out resist.

Different combinations of materials can be used employing the general outline of the example as disclosed in the following table:

| Example No. | 2 | 3 | 4 |
|---|---|---|---|
| Substrate | glass | very thin glass | Polymer transparent to x-rays |
| Intermediate Layer | Ti | Ti | Ta |
| Plating Layer | Au | Cu | Au |
| Resist | Shipley 1350J | Shipley 1350J | PMMA |
| Exposure | u.v. 3,500 ° A | u.v. 3,500 ° A | Electron beam |
| Plated first mask | Au | Cu | Au |
| Resist for back exposure | PMMA | Shipley 1350J | Electron (PMMA) beam resist |
| Exposure | u.v. 2,000 ° A | u.v. 2,000 ° A | x-rays |
| Support layer | Baked PMMA | Baked Shipley 1350J | PMMA |
| Float off | 20% HF water solu. | 20% HF water solu. | 20% HF water solu. |
| Additional support | Evaporated Ti and Au | Evaporated Ti and Cu | Evaporated Ta and Au |

EXAMPLE 5

A 5,000 A layer of Ti is evaporated on a glass substrate transparent to ultraviolet light. A 300 A layer of gold is evaporated atop the Ti at a temperature low enough to avoid alloying the gold and Ti. A 1.5 to 3.0 micron Shipley resist (1350J) is spun coated above the gold layer. This resist is exposed (to 3,500 A u.v.) using conventional exposure techniques employing the desired pattern and the resist is developed. A 1 micron layer of gold is now electro-plated under galvanostatic conditions from a gold bath such as Selrex sulfite complexed DBT 510 bath. The remaining resist is removed with acetone. The exposed plating base of gold is now sputtered etched. Subsequent to the sputter etching the exposed intermediate layer of Ti is chemically etched in a saturated solution of 20% HF solution in water with the process being controlled so as not to under cut the plated gold. The wafer is coated with KFTR diluted in a ratio of 2 parts KTFR to 1 part of KMER thinner and is spun at 3,000 RPM. A Second application of KTFR diluted in a ratio of 6 parts KTFR to 1 part KMER thinner is applied while the wafer is being spun at 3,000 RPM. The two resist applications form a 2 micron thick KTFR film. The resist is air dried for half an hour and baked at 110° C for 10 minutes. The resist is now exposed employing ultraviolet light transmitted through the substrate for 25 seconds and developed for 2 minutes in a KTFR developer. Spray developing and spray rinse conclude the development. The resist residue is plasma etched in an International Plasma Corp. unit in a forming gas using 50 watt power for six to ten minutes. Preferably two 5 minute etch periods are employed with a five minute cooling period in between. Gold is now electro-plated under galvanostatic conditions to a thickness of 2 microns using a Selrex BDT 510 gold bath. A second application of KTFR is employed this time using a single step application process. After the drying specified above and baking the resist is exposed for 90 seconds, again to ultraviolet light transmitted through the substrate. This is followed by an additional plasma etching of resist residue and an additional electro-plating step. A 5 micron thick layer of 1350H Shipley resist is now spun on and a frame mask is exposed and developed using conventional exposure techniques. A 12 to 20 micron layer of gold is now electro-plated in the frame area and the Shipley resist is removed with acetone. The KTFR is removed using a conventional stripper such as J-100 or using plasma of $O_2$ and $N_2$. The remaining portions of the 5,000 A Ti layer are etched in a saturated solution of 20% HF water solution at 90° C for 3 to 4 hours or as long as necessary to float the mask off the substrate. If desired an additional layer of Au can be evaporated to strengthen the mask.

Various combinations of materials can be used employing the general outline of this example as disclosed in the following table:

| Example | 6 | 7 | 8 | 9 |
|---|---|---|---|---|
| Substrate | Glass | Quartz | Very thin glass | Polymer transparent to x-ray |
| Intermediate layer | Cr | Ti | Cr | Ta |
| Plating layer | Au | Cu | Au | Au |
| Resist | Shipley 1350J | Shipley 1350J | Shipley 1350J | PMMA |
| Exposure | u.v. 3,500 ° A | u.v. 3,500 ° A | u.v. 3,500 ° A | x-ray |
| Plated first mask | Au | Au | Au | Au |
| Resist for back exposure | KTFR | KOR | KOR | x-ray negative resist |
| Exposure | u.v. 3,500 ° A | u.v. 2,000 ° A | u.v. 2,000 ° A | x-ray |
| Support layer | Au | Cu | Cu | Au |
| Float off | $AlCl_3$ | 20% HF water solu. | 20% HF water solu. | 20% HF water solu. |
| Additional support | Evaporated Au | Evaporated Cu | Sputtered Cu | Evaporated Au |

What we claim is:

1. A method of fabricating a self-supporting mask with aspect ratio>1 for increasing the strength of said mask and making it capable of being self-supported in which a relatively thin mask is supported on a substrate with an easily selectively removable layer lying between said substrate and said mask, both said layer and said substrate being transparent to selected radiation, said method including the steps of:

coating, to a desired thickness, the exposed surface of said mask with a material sensitive to said radiation, exposing said mask to said selected radiation with said mask located with the substrate lying between said selected radiation and said material, developing said material to remove selected areas of said material, and removing said easily selectively removable layer to lift said mask from said substrate thereby providing a self-supporting relatively thick mask.

2. The method of claim 1 in which said material coated on the exposed surface of said mask comprises a positive resist.

3. The method of claim 2 which further includes a step of baking, subsequent to said developing step in which the temperature of said material is increased sufficient to destroy sensitizer of said resist followed by a step of cooling said material to ambient temperature.

4. The method of claim 2 in which the temperature of said material is increased to at least 110° C, subsequent to said developing step, followed by a step of cooling said material to ambient temperature.

5. The method of claim 4 in which the temperature of said material is increased in a plurality of stages.

6. The method of claim 2 wherein said steps of coating, exposing and developing are carried out a plurality of times prior to said step of removing said easily selectively removable layer.

7. The method of claim 2 in which the desired thickness of said coating step is less than or equal to 15 microns.

8. The method of claim 2 wherein said step of coating is carried out in two operations, said first operation employing a relatively dilute resist and said second operation employing a relatively viscous resist.

9. The method of claim 8 in which each of said coating steps comprises spin coating.

10. The method of claim 2 wherein said selected radiation comprises ultraviolet light.

11. The method of claim 2 wherein said removing step comprises chemical etching of said intermediate layer.

12. The method of claim 1 which includes a step of electroforming a thick support frame subsequent to said developing step and prior to said removing step.

13. The method of claim 1 which includes a further step of strengthening said mask by depositing, by evaporation or sputtering, onto said mask additional non-magnetic material subsequent to said removing step.

14. The method of claim 3 in which said material comprises PMMA.

15. The method of claim 3 in which said baking step is carried out at a temperature of at least 135° C.

16. The method of claim 16 in which said baking step is carried out at a temperature of at least 110° C.

17. The method of claim 2 in which said selected radiation comprises X-ray radiation.

18. The method of claim 17 in which said baking is carried out at a temperature as high as 250° C.

19. The method of claim 1 wherein said material comprises a negative resist.

20. The method of claim 19 which further includes a step of plating metal into areas vacated during said developing step.

21. The method of claim 20 in which said steps of coating, exposing, developing and plating are carried out a plurality of times.

22. The method of claim 19 wherein said desired thickness of said coating step is less than or equal to 15 microns.

23. The method of claim 20 in which said coating step comprises at least two coatings steps, the first of which employs a relatively dilute negative resist, and the second employs a relatively viscous negative resist.

24. The method of claim 19 in which said selected radiation comprises ultraviolet light.

25. The method of claim 19 in which said selected radiation comprises X-ray radiation.

26. The method of claim 19 in which said removing step comprises chemical etching of said intermediate layer.

27. The method of claim 23 in which each of said coating steps comprises spin coating.

28. The method of fabricating a mask for electron beam projection processing which is self-supporting comprises the sequential steps of:

a. coating a substrate transparent to a first radiation with an easily selectively removable layer selected from the group of Cu, Ti, Au, Cr, Ta, Hf, Sb and Zn or mixtures thereof;

b. coating the product of step (a) with a plating base metal selected from the group of Cu, Au, Ag, Zn, Pd and Pt;

c. coating the product of step (b) with a resist sensitive to a second radiation;

d. exposing the product of step (c) to said second radiation which passes through a mask containing a desired pattern;

e. developing said resist, plating metal into areas defined by said developed resist and removing any remaining resist;

f. removing exposed portions of the layer deposited in step (b);

g. removing exposed portions of the layer deposited in step (a);

h. coating the product of step (g) with a second resist sensitive to said first radiation;

i. exposing said second resist to said first radiation which first radiation first passes through said substrate, said second resist being exposed to said first radiation which is not blocked by the metal deposited in step (e);

j. developing said second resist; and, k. removing said removable layer to thereby lift the mask from said substrate.

29. The method of claim 28 in which said second resist is a positive resist and which furher includes a step of baking said developed second resist at a temperature of at least 110° C subsequent to step (j) and prior to step (k).

30. The method of claim 29 in which said baking temperature is at least 135° C.

31. The method of claim 28 in which said resist is a positive resist and which includes the further step of baking said developed second resist at a temperature as high as 250° C subsequent to step (j) and prior to step (k).

32. The method of claim 29 wherein said coating step (h), said exposing step (i), said developing step (j) and said baking step are performed a plurality of times.

33. The method of claim 28 in which said first radiation comprises ultraviolet light.

34. The method of claim 33 in which said ultraviolet light has a wavelength of about 3,500 A.

35. The method of claim 33 in which said ultraviolet light has a wavelength on the order of 2,000 A.

36. The method of claim 28 in which said second resist comprises a negative resist.

37. The method of claim 36 which includes a further step of plating additional metal, subsequent to step (j) into the areas from which said second resist was removed in said step (j).

38. The method of claim 37 in which said coating step (h), said exposing step (i), said developing said (j), and further plating step are carried out a plurality of times.

39. The method of claim 36 in which said removing step comprises chemical etching.

40. The method of claim 28 in which said step (h) comprises a plurality of coating steps, an initial coating step employing a relatively dilute second resist and said subsequent coating step employing a relatively viscous second resist.

41. The method of claim 40 in which each of said plurality of coating steps included in said step (h) includes spin coating.

42. The method of claim 29 in which said first radiation comprises X-ray radiation.

43. The method of claim 28 which includes the further sequential step of depositing, by evaporation or sputtering, an additional non-magnetic material layer.

44. The method of claim 43 in which said additional non-magnetic material is selected from the group of Cu, Au, Ti, Cr and Ta or combinations thereof.

* * * * *

UNITED STATES PATENT AND TRADEMARK OFFICE
CERTIFICATE OF CORRECTION

PATENT NO. : 4,022,927

DATED : May 10, 1977

INVENTOR(S) : Aloysius T. Pfeiffer et al.

It is certified that error appears in the above–identified patent and that said Letters Patent are hereby corrected as shown below:

In column 1, line 54, change "that" to --than--;

in line 58, change "x-rays" to --x-ray--.

In column 9, line 18, change "build" to --built--.

In column 16, claim 28, line 3 change "comprises" to --comprising--.

In column 17, claim 38, line 2 delete "said" and insert therefor --step--.

Signed and Sealed this

Fourteenth Day of February 1978

[SEAL]

Attest:

RUTH C. MASON
Attesting Officer

LUTRELLE F. PARKER
Acting Commissioner of Patents and Trademarks